United States Patent
Menezes (10) Patent No.: US 6,228,243 B1
(45) Date of Patent: May 8, 2001

(54) ELECTROCHEMICAL SYNTHESIS OF CRYSTALLINE COMPOUND OR ALLOY FILMS

(76) Inventor: Shalini Menezes, 722 Rushing Creek Pl., Thousand Oaks, CA (US) 91360

( * ) Notice: Subject to any disclaimer, the term of this patent is extended or adjusted under 35 U.S.C. 154(b) by 0 days.

(21) Appl. No.: 09/246,676

(22) Filed: Feb. 8, 1999

(51) Int. Cl.[7] .............................. C25D 5/10; C25D 11/02; C25D 7/12; C25D 5/54; C23C 28/00
(52) U.S. Cl. ......................... 205/170; 205/171; 205/157; 205/159; 205/162; 205/915
(58) Field of Search ................................. 205/157, 159, 205/170, 171, 915, 162

(56) References Cited

U.S. PATENT DOCUMENTS 5,320,736 * 6/1994 Stickney et al. ..................... 205/157

OTHER PUBLICATIONS

Chemical Engineers' Handbook, Fifth Edition, p. 22–52, ©1973, no month available.*
Quantitative Chemical Analysis, Second Edition, pp. 434–437, 440, 480, and 482, ©1987, no month available.*

* cited by examiner

Primary Examiner—Edna Wong (57) ABSTRACT

A new method to synthesize crystalline films, superlattices and multilayered devices based on metallic or semiconductor compounds or alloys in electrolyte media on non-crystalline substrates. An automated sequence of flow, equilibration and underpotential electrodeposition from a single electrolyte comprising the film constituents leads to the synthesis of stoichiometric, epitaxial layers. The invention process is based on a new concept of electrochemical molecular layer epitaxy; it provides a relatively simple, fast and inexpensive method to fabricate a wide range of high quality technological materials, ranging from large-area single phase films to multiple quantum-well structures.

20 Claims, 4 Drawing Sheets

ELECTROCHEMICAL SYNTHESIS OF CRYSTALLINE COMPOUND OR ALLOY FILMS

BACKGROUND OF THE INVENTION

This invention is directed generally toward methods to synthesize crystalline films, superlattices and multilayered devices based on metallic or semiconductor compounds or alloys, in electrolyte media. More specifically, this invention is directed toward a method for the electrochemical synthesis of molecular layers of compounds or alloys on non-crystalline substrates.

Epitaxial semiconductor films and superlattices are currently sought for a wide range of device applications. Superlattice films can be designed with specific physical, electronic or optical properties. Material utilization, cost and environmental impacts are important concerns during superlattice manufacture. Presently such materials are synthesized with expensive, high temperature vacuum methods, molecular beam epitaxy (MBE) and atomic layer epitaxy (ALE). ALE and MBE methods allow the fabrication of advanced material structures of very thin oriented layers of metallic alloys or semiconductor films but economics and crystalline substrate requirements limit their use as research tools or for small, highly sophisticated expensive devices such as, quantum-well lasers.

Chemical bath deposition (CBD) has been employed for low cost, large area applications; it produces low quality semiconductor films. Electrodeposition offers a simple, low-cost and large area alternative to the vacuum or CBD techniques, in terms of the required capital equipment, power needs and material. It eliminates environmental and safety hazards associated with toxic vapor phase reactants and large volumes of chemical waste. These advantages have been explored by numerous researchers with limited success. Kroger et al first reported the electrodeposition of semiconductor compounds. U.S. Pat. No. 4,426,194 describes the approach. Unfortunately stringent material quality requirements for opto-electronic devices have excluded electrodeposition as an acceptable method for synthesis of semiconductor compounds. Recent works use electrodeposition to produce mainly precursor films as described in U.S. Pat. No. 5,730,832. These films require further vacuum processing to improve stoichiometry and grain size. Thus, economic and scale up barriers of the vacuum steps remain.

Conventional electrodeposition tends to produce small grains and non-stoichiometric films that are unsuitable for devices. The deposition is controlled by the mass transport rate of at least one metal, co-depositing to form a compound. This causes three-dimensional nucleation, hence small grain films. U.S. Pat. No. 5,320,736 describes an electrochemical method for atomic layer epitaxy for the deposition of semiconductors, comprising alternating electrodeposition of atomic layers of selected pairs of elements using underpotential deposition. This method eliminates the mass transport dependence and can produce atomically ordered layer of a compound. It uses a separate solution to deposit each of the component elements, constituting the compound. The use of two or more electrolytes to synthesize one compound evidently requires an elaborate deposition apparatus, a rinse cycle between deposition of each fraction of the monolayer, large quantities of electrolyte and very long (several hours/$\mu$m) deposition period time. Thus, the method is impractical for manufacturing large devices, for example photovoltaic modules; such devices need low-cost, large-area, high-throughput deposition. For many compounds, this approach leads to the re-dissolution of one metal during deposition of the next. Nevertheless, the method provides evidence for the electrochemical epitaxial semiconductor formation.

BRIEF SUMMARY OF THE INVENTION

Accordingly, the object of this invention to provide a new method, 'Electrochemical Molecular Epitaxy' (EME), that is much simpler and more effective than the prior art for the synthesis of crystalline semiconductor films and superlattices and metallic alloys. The EME method is a low-cost electrochemical analogue to MBE, for the synthesis of compound semiconductor superlattices. It combines the cost, scale-up and environmental advantages of electrodeposition with the atomic level control MBE. It aims to synthesize highly ordered, stoichiometric films with a self-regulating, computerized electrodeposition method.

It is another objective to extend this invention to provide a deposition apparatus that: (a) is simple, inexpensive to construct and operate; (b) reduces costs, energy usage, material waste and environmental concerns; (c) allows rapid synthesis of ordered, stoichiometric films or superlattices; (d) is sufficiently versatile for fabrication of quantum well lasers or large-scale PV modules; (e) permits in-situ analysis of electrolyte composition and reaction products; and (f) lowers the level of potential contamination during deposition.

It is a further objective of this invention to devise an integrated system to fabricate multi-layered, multi-component thin-film devices by sequential deposition of each semiconducting film to produce the semiconductor device.

It is yet another objective of this invention to eliminate the need for crystalline substrates to produce epitaxial films by depositing textured semiconducting or metallic films on non-crystalline substrates. This objective in turn would eliminate the high temperature/pressure crystal growth equipment, the substrate size constraints; and the crystal slicing, polishing and pretreatment steps.

To achieve the foregoing and other objectives and advantages in accordance with the purpose of the present invention, as embodied and broadly described herein, the process of this invention includes a sequence of computer controlled flow, equilibration and underpotential electrodeposition steps to construct a semiconductor superlattice, molecular layer at a time, using a specially designed diffusion-layer cell. Each cycle deposits an ordered, stoichiometric molecular layer of a semiconductor compound from a single electrolyte medium containing its constituent elements. Self-limiting reactions and the free energy gain ($\Delta G°$) due to compound formation facilitate the formation of a stoichiometric molecular layer when the substrate is exposed at underpotential to a thin quiescent electrolyte layer containing a predetermined ratio of the constituent ions. The deposition potential and the electrolyte composition can be adjusted to limit the layer growth to a single molecular layer of the compound. The quiescent deposition from a thin solution layer eliminates the mass transport dependence. The small solution volume excludes surface-active impurities from the substrate surface to ensure deposit purity. Computer controlled switching of solutions further permits the successive deposition of different semiconductor films to produce a multi-component thin-film device or a multiple quantum well structure. Thus, similar to MBE, the EME method allows molecular level control, electrical doping control and facilitates the transition from the fabricating the substrate to a complete electro-optic device which may contain quantum well structures. Unlike MBE, the EME approach offers all the advantages of prior art electrochemical synthesis techniques. It incorporates environmental benefits, amenability to large-area scale-up, irregular shapes and flexible substrates and low-temperature epitaxial growth without inter-diffusion. much lower cost, practical (much faster) deposition rates, and low material and energy requirements.

The EME method offer many advantages over the prior electrodeposition art, including the method described in U.S. Pat. No. 5,320,736. The use of a single multi-ionic electrolyte for the deposition of one compound eliminates cross contamination problems and rinse cycles, greatly simplifies the deposition apparatus design and reduces the time by orders of magnitude. It alleviates the formation of flow pattern that tend to result from alternate electrolyte deposition. Since EME uses one single solution and equilibrated quiescent deposition to form successive layers of a compound, it avoids residual contamination from the preceding electrolyte.

The EME invention permits in-situ electrolyte analysis, deposit characterization and even stoichiometry correction. Coulometry provides instantaneous layer composition analysis. Non-stoichiometry if detected, may be corrected by applying a potential step to dissolve the excess metal.

Other objectives, advantages and novel features of the present EME invention will be apparent to those skilled in the art from following detailed description of the preferred embodiment and accompanying drawings.

DETAILED DESCRIPTION OF THE INVENTION

The invention process is based on sound theoretical principles and fundamental concepts regarding the nucleation process during electrodeposition. The EME method integrates two basic electrochemistry concepts: underpotential deposition and diffusion layer deposition with two new concepts: molecular layer formation and texture evolution with multilayered deposition. This unique combination of concepts leads to a remarkably simple but a powerful technique for thin-film synthesis. U.S. Pat. No. 5,320,736 uses underpotential deposition of an element from a thin layer electrolyte to produce one half of a monolayer of a compound. The present EME invention incorporates two additional concepts, compound formation and texture evolution, extending the practical utility of the electrochemical deposition process to device fabrication by using simpler apparatus and practical deposition rates.

Figure 1A:
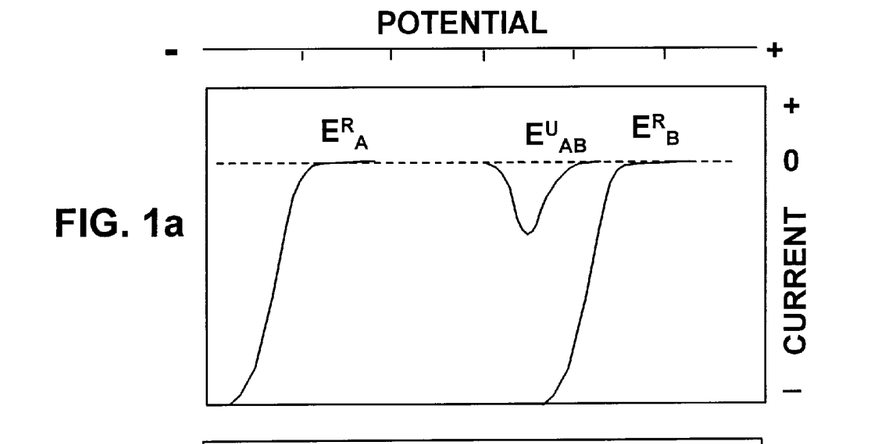
FIG. 1a is a current voltage representation of an AB molecular layer formation at underpotential, $E^U_{AB}$, from an electrolyte containing dissolved ions of A and B when the reversible potentials, $E^R_A$ and $E^R_B$, are wide apart.
Figure 1B:
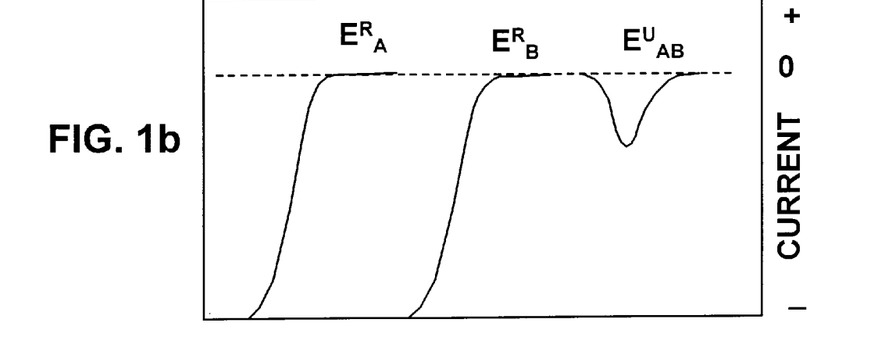
FIG. 1b is a current voltage representation of an AB molecular layer formation at $E^U_{AB}$ when $E^R_A$ and $E^R_B$ are close in value.

The following description clarifies the underlying scientific bases for the EME process:

Underpotential ($E^U$) deposition takes advantage of the fact that thermodynamics favors a monolayer formation at $E^U$ over bulk element growth at the standard reversible potential, $E^R$. The current(I)-voltage(E) curves in FIGS. 1a and 1b illustrate two cases based on this phenomenon for the hypothetical formation of a generic compound or alloy, AB, when the ions of both elements A and B are simultaneously present in the electrolyte in a predetermined ratio. The element B is assumed to be less noble than the element A. The $\Delta G°_{AB}$ provided by the reaction $A_{(s)}+B_{(s)} \to AB$, facilitates the formation of the AB compound. Thus, the underpotential ($E^U_{AB}$) for the AB monolayer formation shifts positive of the $E^R_B$ for the $B^{+n}/B$ couple FIG. 1a. In certain cases, the $E_{AB}$ shifts positive of the $E^R_A$ and $E^R_B$ for both redox couples, $A^{+m}/A$ and $B^{+n}/B$, FIG. 1b.

Theoretical treatment for the formation of compounds and alloys have been presented in the references by Kroger (1978) and by Engelken (1988). Kroger distinguishes two classes of co-deposited compounds: For class I compound, $E^R_B > E_{AB} > E^R_A$. Class II compounds can deposit at $E_{AB} > E^R_B > E^R_A$. According to Engelken class II compounds are formed with nearly perfect AB stoichiometry over broad potential ranges with negligible sensitivity to temperature and mass transport. Any element in excess to that required by the equilibrium constant-mass action law should dissolve immediately.

Figure 1C:
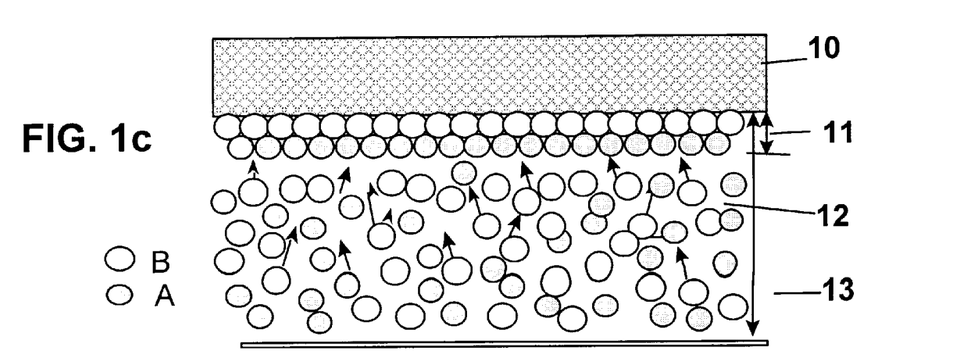
FIG. 1c is a schematic representation of two-dimensional formation of an epitaxial AB molecular-layer on a crystalline substrate.

FIG. 1c illustrates a drawing of epitaxial deposition of the film AB 11 on an electrode substrate 10. In the first cycle an AB molecular layer deposits on the substrate 10 at $E^U_{AB(substrate)}$ from a thin solution layer 12 confined within a gap 9, containing ions of elements A and B in the cathode compartment 13. At Deposition at $E^U_{AB(substrate)}$ promotes two-dimensional growth of the AB layer which mimics the substrate 10 texture for epitaxial growth. This texture is transmitted to the next AB molecular layers which deposits at $E^U_{AB}$ on the first AB layer during the second cycle. The values of $E^U_{AB}$ and $E^U_{AB(substrate)}$ are potentiostatically controlled. An epitaxial AB film 11 is constructed by the sequential deposition of n AB layers at the underpotential of $E^U_{AB}$, preferably at the rate one molecular layer per cycle.

Figures 2A, 2B, 3:
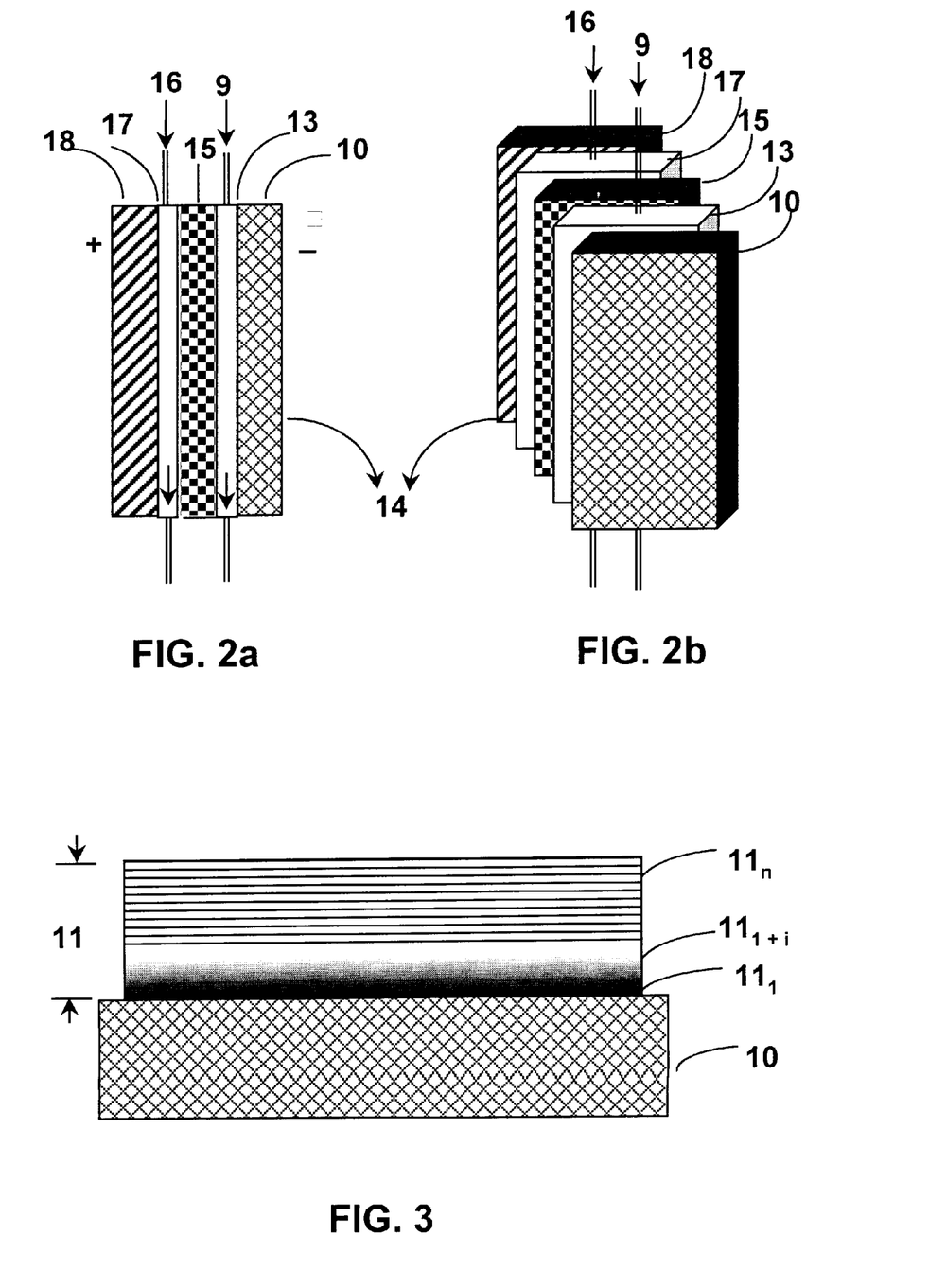
FIG. 2a shows a schematic of cross-sectional view of a diffusion-layer electrochemical cell.
FIG. 2b shows the front view of the diffusion-layer electrochemical cell components.
FIG. 3 shows the evolution of texture with the successive deposition of molecular layers on a polycrystalline substrate.

FIGS. 2a and 2b show two schematic views of a diffusion-layer cell 14 needed for EME synthesis of thin-films or devices. This cell 14 provides a large surface area electrode substrate 10 and a narrow gap 9 for the solution 12 flow through the cathode compartment 13. A separator plate 15 made of porous fritted glass or a membrane separates the anolyte 16 compartment 17 and anode 18 avoiding any interference from the anode reaction products during the film 11 deposition.

The diffusion-layer cell 14 configuration is uniquely suited for EME synthesis of molecular-layers 11. Its geometry confines the reactant ions within a thin solution layer 12 in the gap 9, providing each reactant ion an immediate access to the electrode surface and hence for uniform nucleation. The thin solution layer establishes equilibrium instantly with the electrode 10 surface promoting epitaxy. Quiescent deposition avoids mass transport and flow pattern complications, preventing non-uniform nucleation and deposit polycrystallinity. The electrolyte composition controls the deposit stoichiometry precisely.

The diffusion layer cell can be used to grow epitaxial films on a crystalline cathode substrate 10, such as Si (111) as depicted in FIG. 1c. Such films can be synthesized for use in small high end devices only. Many low cost, large area devices such as solar cells, are fabricated on low-cost substrates 10 comprising of glass coated with metal, conducting oxide or semiconductor. This invention discloses a strategy to grow textured semiconductor compound films on a non-crystalline substrate 10, which may be used for most practical applications. FIG. 3 illustrates the evolution of texture with the growth of each new molecular layer. The initial molecular layer $11_1$, deposited on the polycrystalline substrate 10 may have random orientation. Intermediary layers $11_{1+i}$ develop increasing texture with the successive re-nucleation of each new molecular layer $11_i$ as the superlattice is built up. The outermost layers $11_n$ will be textured.

Figure 4:
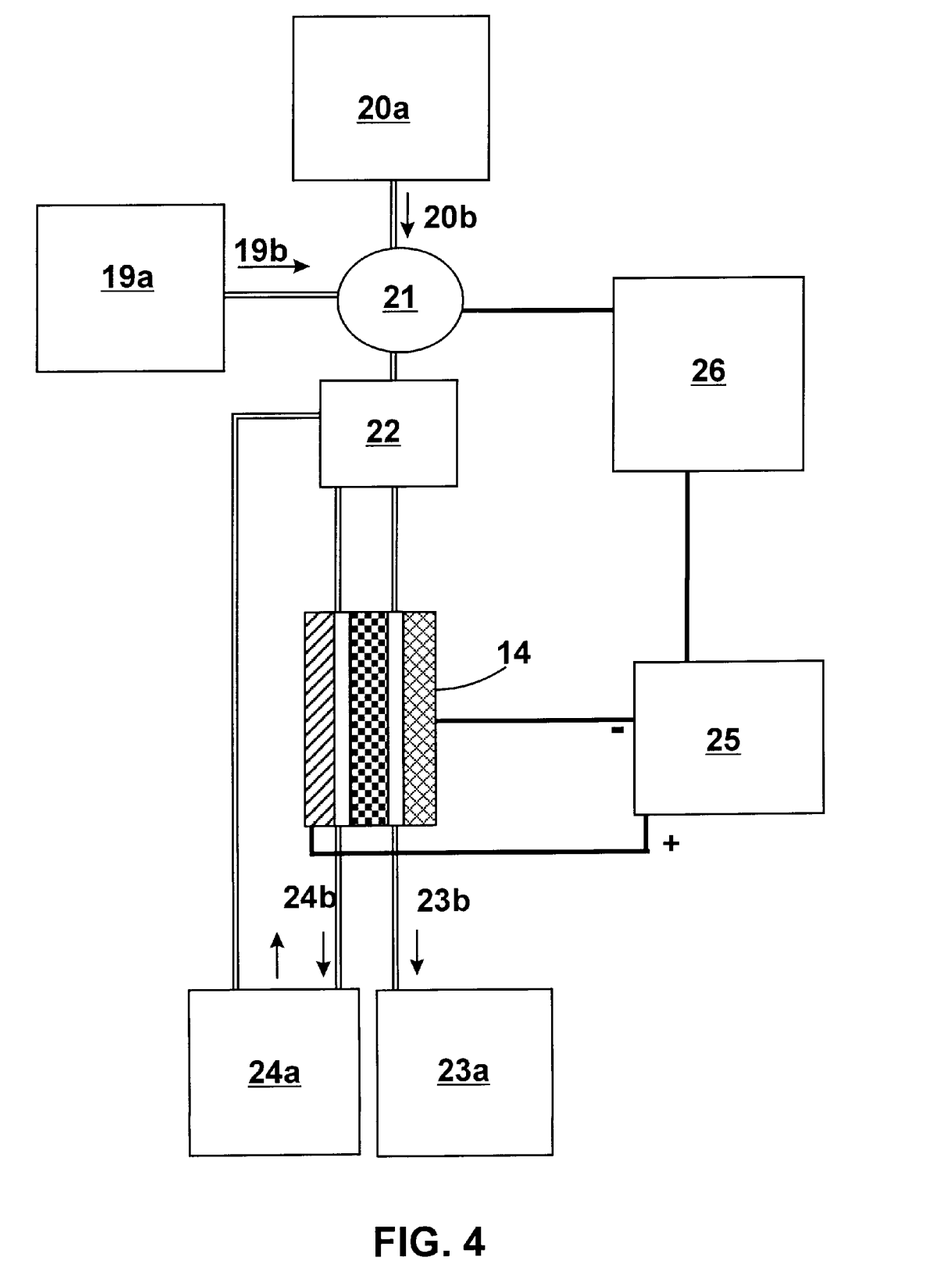
FIG. 4 shows the general experimental set-up used for the electrochemical synthesis of epitaxial molecular layers.

FIG. 4 illustrates a basic deposition system incorporating the diffusion layer cell 14. A reservoir 19a stores the electrolyte 12 and connects to the deposition chamber 13 through a feed line 19b. Additional reservoirs, such as, reservoir 20a with a feed line 20b, may be connected to the system, as needed for deposition of different materials. A solenoid distribution valve 21 and a perilstatic pump 22 control the delivery and discharge of the solution from the reservoir 19a or 20a to the deposition compartment 13 of the cell 14, the waste electrolyte container 23a and drain channel 23b. A reservoir 24a stores the anolyte 16 that is circulated through a separate solution delivery circuit 24b connected to the anode compartment 17 of the cell 14. A potentiostat 25 controls the deposition potentials, $E^U_{AB}$ and $E^U_{substrate}$. A computerized process control system 26 synchronizes the switching, pumping, delivery, equilibration and deposition parameters. It can also monitor the deposition process.

The critical experimental parameters for EME deposition, electrolyte composition, deposition potential, equilibration time and layer deposition time, may be identified by conducting in-situ coulometric and voltammetric studies of redox reactions for the species A and B using a diffusion layer cell 14 provided with an inert metal electrode 10. In contrast to conventional large volume electrolyte cells, the reaction products remain at the electrode 10 surface in the deposition cell 14 until they are flushed out. Thus, film formation and dissolution processes may be quantitatively analyzed to identify the deposition potentials and to derive a suitable concentration ratio, A:B, in the electrolyte 12. The later is specially critical for the synthesis of class I compounds with a large difference between $E^R_A$ and $E^R_B$ as depicted in FIG. 1a. It is essential to limit the concentration of the noble element B to deposit one atomic layer in each cycle. The concentration of B will depend on the diffusion layer cell 14 geometry, the magnitude of $(E^R_A-E^R_B)$ and the reaction kinetics. The electrolyte composition can be determined with in-situ voltammetry and then adjusted to produce a stoichiometric AB molecular-layer per cycle. The deposition of class II compounds will require less stringent parameter control. The deposition of more than one molecular layer per cycle could still produce a stoichiometric class II compound.

Molecular layer deposition can be monitored by tracking the current transients during the deposition. This provides information on the nucleation, growth kinetics, dissolution and conductivity of the layers. This information can be used to control the electrolyte flow rate and equilibration time. Surface analysis can serve as a complementary means to derive relationships between the properties of the electrodeposited layers and the deposition parameters.

Type AB superlattice is formed through an automated sequence of filling the deposition cell 14 with an electrolyte 12 having a predetermined composition of the $A^{m+}/B^{n+}$ ions, equilibrating the system and depositing a single AB molecular layer per cycle. The elements A and B may be selected from Groups I–VII. The electrolyte may contain an appropriate dopant to produce a desired carrier concentration for the AB semiconductor. Computer control automates the flow, equilibration and deposition sequence to construct the superlattice of a desired thickness comprising AB molecular layers.

The EME invention will have widespread uses for developing a broad spectrum of strategic material structures, ranging from crystalline single-phase films to ultra-thin layered superlattices of semiconductor compounds and alloys. The following examples further clarify the unique features and the application of the present invention to fabricate thin films and devices.

EXAMPLE 1

The set-up depicted in FIG. 4 is used to fabricate an AB type compound where A=Cu and B=Se via EME invention. Only one electrolyte reservoir 19a is needed to provide the Cu and Se ions to deposit a CuSe film. The electrolyte 12, FIG. 2, comprises $H_2SeO_3$ and $CuSO_4$ and a supporting electrolyte medium at pH ~2 such as, $K_2SO_4$, citric acid, etc. The critical experimental parameters are identified by conducting in-situ coulometry, voltammetry and chronoamperometry for the $Cu^{2+}/Se^{4+}$ electrolyte in a test diffusion layer cell 14 with an inert metal substrate 10 and with geometry, analogous to the deposition cell 14. The experimental parameters derived are used to formulate the electrolyte composition with an appropriate concentration ratio of $Cu^{2+}$ and $Se^{4+}$ ions to produce a stoichiometric CuSe molecular-layer per cycle. A CuSe film 11, FIG. 3, may be synthesized on a Mo coated glass substrate 10 that is commonly used for photovoltaic devices. Although $|E^U_{Cu}-E^U_{Se}|=0.4V$, this system behaves as a class II due to the sluggish $Se^{4+}$ reduction reaction. An automated sequence of filling the deposition cell 14, FIG. 2, with the $Cu^{2+}/Se^{4+}$ electrolyte 12, equilibrating the system and applying a potential $E^U_{CuSe}$ leads to the deposition of CuSe molecular layers. As depicted in FIG. 3, the first few CuSe layers $11_{1+i}$, deposited on the polycrystalline Mo base 10 will have random orientation. The outer layers of the CuSe film $11_n$ will develop increasing texture as the CuSe film builds up.

EXAMPLE 2

The EME invention offers a low cost simpler alternative to MBE for the fabrication of ZnSe single crystal substrates for the laser diodes. A thin polycrystalline ZnSe film is deposited on a glass or an equivalent substrate by CBD from a solution containing $ZnCl_2$, $Na_2SeSO_4$, triethylamine, NaOH, $N_2H_4.H_2O$ at 100° C. The ZnSe coated glass provides a lattice matched substrate 10 for the growth of crystalline ZnSe molecular layers 11 by the EME method of this invention, FIG. 3. The n-type conductivity of the polycrystalline ZnSe film facilitates the EME deposition of the crystalline ZnSe film 11 under forward bias. The electrolyte 12, FIG. 2, comprises a solution of $H_2SeO_3$, $ZnSO_4$ and $K_2SO_4$. The critical experimental parameters, derived as in example 1 but for a $Zn^{2+}/Se^{4+}$ electrolyte, are used to formulate the electrolyte 12 composition with an appropriate concentration ratio of $Zn^{2+}$ and $Se^{4+}$ ions to produce a stoichiometric ZnSe molecular-layer per cycle. The ZnSe film 11 is formed as in example 1 through an automated sequence of pumping $Zn^{2+}/Se^{4+}$ electrolyte, equilibrating and depositing a single ZnSe molecular layer per cycle at underpotential $E^U_{ZnSe}$. The outer layers of the ZnSe film 11 develop increasing texture as the ZnSe superlattice is constructed, FIG. 3.

Figure 5:
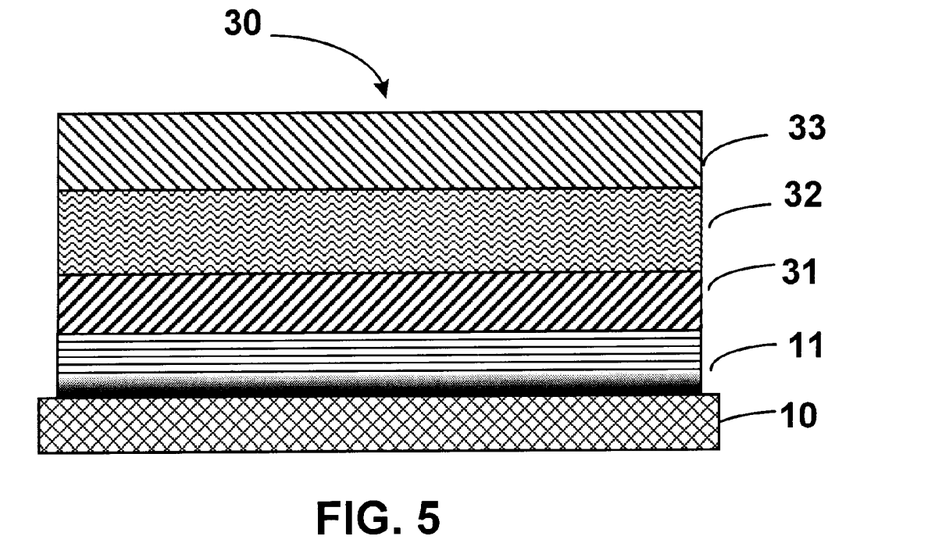
FIG. 5 illustrates the structure of a ZnSe laser diode grown by EME on polycrystalline ZnSe.

The EME invention further allows the growth of epitaxial layers of ZnSe and its alloys on the ZnSe film 11, to fabricate the entire ZnSe laser device 30, FIG. 5. The device 30 comprises a ZnSe coated glass substrate 10, ZnSe film 11, a n-doped ZnSe epilayer 31, ZnSe-alloy quantum well (e.g. CdZnSe) 32, and a p-doped ZnSe epilayer 33. The ZnSe device 30 components 31–33 are deposited from different electrolytes stored in different reservoirs and connected to the deposition apparatus 14 through feed lines, as in FIG. 4. Each electrolyte reservoir contains a predetermined composition of the ionic species to produce molecular layers with the required stoichiometry for the device components 31 through 33. For example, a $Cd_xZn_{1-x}Se$ quantum well is deposited from an electrolyte containing $H_2SeO_3$, $CdSO_4$, $ZnSO_4$ and $K_2SO_4$. A suitable ratio of Cd:Zn:Se is derived, as discussed in the detailed description. Multiple quantum wells may also be synthesized by depositing alternate layers of ZnSe and $Cd_xZn_{1-x}Se$ to form a superlattice. The computer 26 is programmed to control the electrolyte flow, the deposition potential and the solenoid valve 21 to produce the desired number of molecular layers for each of the device components 31 through 33. A rinse cycle using a pure supporting electrolyte solution may be introduced between the deposition of each device component as needed. A rinse cycle is not needed during the deposition of molecular layers of the same component.

The deposition parameters allow considerable flexibility in designing device structures. For example, an epitaxial single phase ZnSe film 11 may be obtained by fixing the deposition potential and the electrolyte composition. On the other hand by alternating the deposition potential between two values, two alloy compositions can be deposited from one electrolyte. Such maneuvering allows the construction of quantum well structures. For example, alternating layers (each comprising of one or more molecular layers with the same stoichiometry) of $Zn_xMg_{1-x}Se$ and $Zn_yMg_{1-y}Se$, where x>y, may be synthesized by alternating the deposition potential between $E^U_{ZnSe}$ and $E^U_{MgSe}$.

EXAMPLE 3

Figure 6:
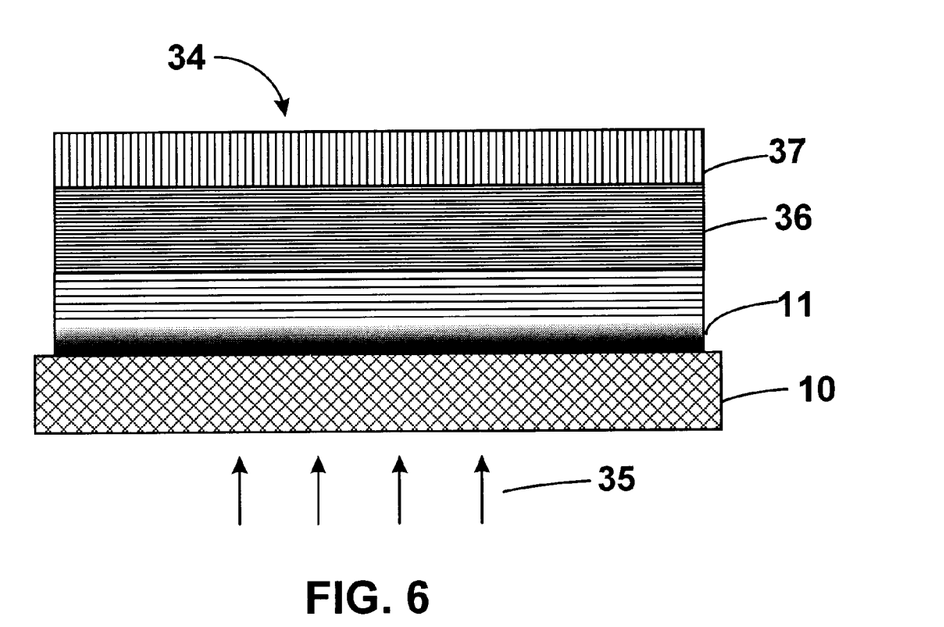
FIG. 6 illustrates the structure of a ZnSe/CuInSe$_2$ superstrate solar cell grown by EME on transparent conducting oxide coated glass.

The EME invention can be applied to construct a superstrate solar cell 34 with the configuration of glass/ZnO/n-ZnSe/p-$CuInSe_2$/metal. The ZnO coated glass substrate 10 allows the light 35 through to illuminate the ZnSe/$CuInSe_2$ junction. The ZnSe epilayer 11 window is deposited via EME on as described in example 2. The ZnSe film 11 will have texture in the top layers, which form the crucial space charge region of the n/p device. These layers also serve as a crystalline substrate for the EME growth of a $CuInSe_2$ 36 epilayer. A metal contact 37 completes the device.

The EME synthesis of the $CuInSe_2$ compound takes advantage of self-limiting reactions and thermodynamically favored $CuInSe_2$ compound formation i.e., its low free energy of −254 kJ/mol, to control the $CuInSe_2$ layer stoichiometry. The $CuInSe_2$ molecular layers may be deposited to produce the absorber layer 36 from an electrolyte containing a predetermined ratio of $Cu^{2+}:In^{3+}:Se^{4+}$. The combination of underpotential deposition and the precise electrolyte composition self-limits the deposition to form one $CuInSe_2$ molecular layer per cycle. The electrochemical potential ordering of the ions and tendency for compound formation leads to lamellar deposition of Cu—Se—In—Se atomic layers.

The EME method offers the flexibility for fabricating a variety of cell configurations. It may be used to fabricate the conventional configuration, glass/Mo/p-$CuInSe_2$(alloy)/n-CdS/ZnO solar cell. Composition gradients in the absorber layer 11 may be introduced ions by slight alteration of the deposition potential. In-rich or Cu-rich $CuInSe_2$ phases may be generated the film by switching the electrolyte to the desired composition. Electrolytes containing an appropriate ratio of Cu:(In+Ga):(Se+S) may be used to increase the bandgap for high efficiency devices. Initially, ex-situ composition analysis of the EMP synthesized films may be needed to optimize the electrolyte composition, particularly in the case of ternary and multinary compounds, e.g., $CuInSe_2$, $CuInGa(SSe)_2$. The electrolyte composition may be formulated based on the correlation obtained between voltammetric and composition analysis results.

The surface of the semiconductor film 36 may be further transformed into a different material by reacting the surface molecular layers with an appropriate electrolyte in the same diffusion layer cell 14. For example, the surface layers of n-$CuInSe_2$ or its alloy may be converted to p-$CuISe_3$ to create a n/p heterojunction as described in U.S. Pat. No. 5,286,306. Other examples include chemical or electrochemical surface modification with appropriate combination of electrolyte composition and applied potential as partially described in reference by Menezes et al. Such modifications can be used to produce off-stoichiometric, depleted, inverted or doped surface or to widen bandgap in the surface region.

The other cell components can be successively deposited by EME from different electrolytes containing ions from each semiconductor or metal component. The deposition parameters for each thin-film layer may be separately identified using in-situ voltammetry for a given geometry of the diffusion-layer cell 14.

It is thus evident that the EME method and the deposition apparatus of the invention provides a relatively simple, fast and inexpensive fabrication method to produce a wide range of high quality technological materials, ranging from large-area single phase films to multiple quantum-well structures. The EME method can replace the present complex and expensive ALE, MBE and bulk crystal growth methods in the semiconductor industry. Eliminating vapor-phase gases and waste associated with the current vacuum methods would alleviate environmental concerns. Lowering the deposition temperature reduces inter-diffusion between the layers. Removing the fabrication cost factor can create new high applications for the crystalline thin-film technology.

The specifics in the above description should not be construed as limitations on the scope of the invention, but rather as exemplification of one preferred embodiment thereof. Many other variations are possible. Considerable versatility exists in the design of the deposit structure. For example, the substrate may be non-planar, structured or contain multiple electrodes; the electrolyte may be aqueous, non-aqueous or molten salt. Computer designed potential waveforms synchronized with the electrolyte flow rate, electrolyte switching, equilibration period and deposition time period can lead to numerous variations of superlattice configurations. The apparatus design also presents considerable flexibility to fabricate and further process the semiconductor films. Electrolyte reservoirs may be added or subtracted as needed to produce multilayered devices, as well as, to modify the electronic and surface properties of EME deposited films.

The method may be used to create bimetallic nano-layered alloys. These materials presently fabricated by high temperature vacuum methods have demonstrated unusual mechanical, electric, magnetic, thermal and optical properties as the layer thickness approaches about 20 Å. Replacing the vacuum methods with the EME method to deposit atomically controlled metallic materials will expand their application horizons to new arenas of low-dimensional structures, while lowering the cost of existing devices and structures.

The commercial applicability of the EME process hinges on its simplicity, speed and scale-up. The EME method is user-friendly and readily amenable to scale-up for large area applications. Its scale-up can take advantage of the existing automation and process lines in the electroplating industry. Commercial modular flow cell units may be modified to simulate the diffusion layer cell 14 proportions and engineered to provide uniform hydrodynamics and current distribution. More importantly, they can be stacked to fabricate several devices or structures simultaneously.

The above description and examples for producing high quality semiconducting compounds, superlattices and metallic structures is intended for or illustrative purposes only of the best mode of the invention contemplated by the inventor. Accordingly, the scope of the invention should be determined not by the embodiments illustrated, but by the appended claims and their legal equivalents. Those skilled in the art may identify variations and alterations without departing from the spirit of the invention, which is defined by the following claims.

References Cited

U.S. PATENT DOCUMENTS

| PATENT | INVENTOR | ISSUED | TITLE |
| --- | --- | --- | --- |
| 4426194 | Kroger et al | 1/1984 | Photovoltaic power generation means and methods |
| 5730852 | Bhattacharya et al | 3/1998 | Preparation of $Cu_xIn_yGa_zSe_n$ (x = 0–2, y = 0–2, z = 0–2, n-0–3) precursor films by electrodeposition for fabricating high efficiency solar cells. |
| 5320736 | Stickney et al | 6/1994 | Method to electrochemically deposit compound semiconductors |
| 5286306 | Menezes | 2/1994 | Thin film photovoltaic cells from I-III-VI-VII compounds |

OTHER PUBLICATIONS

| Author, Journal | TITLE |
| --- | --- |
| Kroger, J. Electrochem Soc, vol 125, No. 12, Dec. 1978, p. 2028–2034 | Cathodic deposition and characterization of metallic or semiconducting binary alloys or compounds |
| Engelken, J. Electrochem Soc, vol 135, No. 4, April 1988, p. 834–839 | Ionic electrodeposition of II-VI and III-V compounds |
| Menezes et al, Proceedings of 26th IEEE PV Specialists Conf, 1997, p. 411 | Modification of the dead layer on surfaces of $CuInSe_2$ and its alloys |

Reference Numerals in Drawings

Reference Numerals In Drawings

| | |
| --- | --- |
| 9. gap | 21. solenoid distribution valve |
| 10. substrate | 22. perilstatic pump |
| 11. molecular layers of AB | 23. waste electrolyte container (b) feed line |
| $11_1$ non-oriented AB layer | 24. anolyte (a) reservoir; (b) feed lines |
| $11_{1+i}$ intermediary AB layers | 25. potentiostat |
| $11_n$ oriented AB layers | 26. computer control system |
| 12. catholyte | |
| 13. cathode compartment | 30. ZnSe device |
| 14. diffusion layer cell | 31. n-doped ZnSe epilayer |
| 15. fritted separator | 32. ZnSe-alloy quantum well |
| 16. anolyte | 33. p-doped ZnSe epilayer |
| 17. anode compartment | 34. $CuInSe_2$ superstrate cell |
| 18. anode | 35. illumination |
| 19. (a) electrolyte reservoir; (b) feed line | 36. $CuInSe_2$ film |
| 20. additional (a) reservoir; (b) feed line | 37. metal contact |

What I claim as my invention is:

1. A method for electrochemically synthesizing epitaxial molecular layers of a semiconductor onto a substrate from an electrolyte containing ions of different elements that constitute said semiconductor, comprising the steps of:

a) providing a means to predetermine process parameters;

b) providing said electrolyte;

c) providing a means for controlling the flow and equilibration of said electrolyte;

d) providing a means for controlling the electrochemical potential of said substrate;

e) electrodepositing the ions from said electrolyte simultaneously to form at least one molecular layer of desired stoichiometry using said predetermined parameters in one cycle; and f) repeating step (e) until a desired film thickness for said semiconductor is obtained.

2. The method of claim 1 wherein said molecular layer is deposited under quiescent conditions.

3. The method of claim 1 wherein the molecular layer of a semiconductor is deposited at a pre-identified underpotential.

4. The method of claim 1 wherein said substrate is selected from polycrystalline, crystalline, amorphous or glass materials.

5. The method of claim 1 wherein said means to predetermine process parameters includes voltammetric and coulometric assessment of the electrochemical synthesis for said molecular layers.

6. The method of claim 1 wherein said electrolyte contains a dopant to produce a desired carrier concentration for said semiconductor.

7. The method of claim 1 where the surface of said semiconductor is further transformed into a material with new properties.

8. A method of claim 1 wherein said semiconductor comprises $AB_xC_{1-x}(D_yEl_{1-y})_2$ molecular layers where $0 \geq x \geq 1$, $0 \geq y \geq 1$ and the A, B, C, D and E are selected from Group IB, IIIA or VIA of the periodic table of elements.

9. The method of claim 1 to successively synthesize different components of a multi-layered semiconductor device.

10. The method of claim 1 wherein said electrolyte is non-aqueous.

11. The method of claim 1 wherein said substrate comprises a plurality of electrodes.

12. The method of claim 1 to fabricate multiple devices simultaneously.

13. A method for electrochemically synthesizing a periodic superlattice on a substrate with each period containing alternate layers of at least two materials and each material layer comprising at least one molecular layer, comprising the steps of:

a) providing a plurality of electrolytes, each containing a predetermined ratio of different ions of elements constituting said molecular layer, in effective amounts for yielding the desired composition of said material;

b) providing a means for switching and controlling the flow of said electrolytes into a deposition chamber;

c) providing a means for controlling the electrochemical potential of said substrate for the deposition of said molecular layers for each material;

d) electrodepositing the different ions from one of said each electrolyte simultaneously to form a plurality of molecular layers with desired stoichiometry to produce a first superlattice material layer of a desired layer thickness;

e) repeating step (d) for the other superlattice layers in said period, using each of the other electrolytes; and f) repeating the sequence of depositing all the superlattice layers in said period to construct a desired device structure.

14. A method of claim 13 wherein the superlattice materials comprise alternating layers of different alloy compositions.

15. A method of claim 14 wherein said alloy compositions include at least in part $n(A_xB_{1-x}C)$ and $m(A_yB_{1-y}C)$ material layers where n and m refer to the number of respective molecular layers, $0 \geq x \neq y \geq 1$, the A and B elements are selected from Group I, II or III and the element C is selected from Group V or VI.

16. A method of claim 14 wherein said alloy compositions include at least in part $n(A_xB_{1-x}C)$ and $m(A_yB_{1-y}C)$ material layers where n and m refer to the number of respective molecular layers, $0 \geq x \neq y \geq 1$, elements A is selected from Groups I, II or III and the elements B and C are selected from Groups V, VI or VII.

17. The method of claim 13 wherein at least one component of the superlattice is synthesized by electroless deposition.

18. A method for electrochemically synthesizing molecular layers of a material onto a substrate from an electrolyte containing ions of different elements that constitute said material comprising the steps of:

a) providing said electrolyte;

b) providing a means for controlling the flow and equilibration of said electrolyte;

c) providing a means for controlling the electrochemical potential of said substrate;

d) electrodepositing said different elements simultaneously to form at least one molecular layer of desired stoichiometry using predetermined parameters in one cycle; and e) repeating step (d) until a desired film thickness for the material is obtained.

19. A method of claim 18 wherein at least one of said molecular layers of material comprises one element.

20. The method of claim 18 wherein at least one of said molecular layers of material is selected from the material groups consisting of metallic alloys, polymers and ceramics.

* * * * *